(12) United States Patent
Makala et al.

(10) Patent No.: US 7,927,977 B2
(45) Date of Patent: *Apr. 19, 2011

(54) METHOD OF MAKING DAMASCENE DIODES USING SACRIFICIAL MATERIAL

(75) Inventors: Raghuveer S. Makala, Sunnyvale, CA (US); Vance Dunton, San Jose, CA (US); Yoichiro Tanaka, Santa Clara, CA (US); Steven Maxwell, Sunnyvale, CA (US); Tong Zhang, Palo Alto, CA (US); Steven J. Radigan, Fremont, CA (US)

(73) Assignee: SanDisk 3D LLC, Milpitas, CA (US)

( * ) Notice: Subject to any disclaimer, the term of this patent is extended or adjusted under 35 U.S.C. 154(b) by 149 days.

This patent is subject to a terminal disclaimer.

(21) Appl. No.: 12/458,543

(22) Filed: Jul. 15, 2009

(65) Prior Publication Data
US 2011/0014779 A1    Jan. 20, 2011

(51) Int. Cl.
*H01L 21/20* (2006.01)
*H01L 21/36* (2006.01)

(52) U.S. Cl. .......... 438/478; 257/E21.017; 257/E21.09; 257/E21.102; 438/44; 438/360; 438/488; 438/496; 438/700

(58) Field of Classification Search .......... 257/E21.017, 257/E21.09, E21.102; 438/44, 360, 478, 438/488, 496, 700
See application file for complete search history.

(56) References Cited

U.S. PATENT DOCUMENTS

| | | |
|---|---|---|
| 5,891,778 A | 4/1999 | Wen |
| 5,915,167 A | 6/1999 | Leedy |
| 5,937,280 A | 8/1999 | Wen |
| 6,429,449 B1 | 8/2002 | Gozalez et al. |
| 6,750,091 B1 | 6/2004 | Gozalez et al. |
| 7,285,464 B2 | 10/2007 | Herner et al. |
| 7,575,984 B2 | 8/2009 | Radigan et al. |
| 7,629,247 B2 * | 12/2009 | Hsia et al. ............. 438/621 |
| 2002/0163027 A1 | 11/2002 | Skotnicki et al. |
| 2004/0157354 A1 | 8/2004 | Kuriyama et al. |
| 2005/0012119 A1 | 1/2005 | Herner et al. |
| 2005/0052915 A1 | 3/2005 | Herner et al. |
| 2005/0062079 A1 | 3/2005 | Wu et al. |
| 2005/0098800 A1 | 5/2005 | Herner et al. |

(Continued)

FOREIGN PATENT DOCUMENTS

JP    4-67671    3/1992

(Continued)

OTHER PUBLICATIONS

Office Action mailed Dec. 9, 2009 in U.S. Appl. No. 12/007,780.

(Continued)

*Primary Examiner* — Asok K Sarkar
(74) *Attorney, Agent, or Firm* — The Marbury Law Group, PLLC

(57) ABSTRACT

A method of making a semiconductor device includes forming a first layer comprising a seed material over an underlying layer, forming a second layer comprising a sacrificial material over the first layer, the sacrificial material being different from the seed material, patterning the first layer and the second layer into a plurality of separate features, forming an insulating filling material between the plurality of the separate features, removing the sacrificial material from the separate features to form a plurality of openings in the insulating filling material such that the seed material is exposed in the plurality of openings, and growing a semiconductor material on the exposed seed material in the plurality of openings.

26 Claims, 8 Drawing Sheets

U.S. PATENT DOCUMENTS

| | | |
|---|---|---|
| 2006/0087005 A1 | 4/2006 | Herner |
| 2006/0284237 A1 | 12/2006 | Park et al. |
| 2006/0292301 A1 | 12/2006 | Herner |
| 2007/0086235 A1 | 4/2007 | Kim et al. |
| 2007/0090425 A1 | 4/2007 | Kumar et al. |
| 2007/0164309 A1 | 7/2007 | Kumar et al. |
| 2008/0078984 A1 | 4/2008 | Park et al. |
| 2008/0316809 A1 | 12/2008 | Herner |

FOREIGN PATENT DOCUMENTS

| | | |
|---|---|---|
| JP | 6-334139 | 12/1994 |
| KR | 100 766 504 B1 | 10/2007 |
| WO | WO 2007/067448 A1 | 6/2007 |

OTHER PUBLICATIONS

U.S. Appl. No. 12/007,780, filed Jan. 15, 2008, Herner et al.
U.S. Appl. No. 12/007,781, filed Jan. 15, 2008, Dunton et al.
Office Action mailed May 27, 2009 in related U.S. Appl. No. 12/007,780.
Herner, S.B., "Low Temperature Deposition and Crystallization of Large-Grained Ge Films on TiN", Electrochemical and Solid-State Letters, vol. 9(5), (2006), pp. G161-G163.
Herner, S.B. et al., "Homogeneous Tungsten Chemical Vapor Deposition on Silane Pretreated Titanium Nitride", Electrochemical and Solid-State Letters, vol. 2(8), (1999), pp. 398-400.

* cited by examiner

METHOD OF MAKING DAMASCENE DIODES USING SACRIFICIAL MATERIAL

The present invention relates generally to the field of semiconductor device processing, and specifically to a method of making a non-volatile memory device.

BACKGROUND

Herner et al., U.S. patent application Ser. No. 10/955,549 filed Sep. 29, 2004 (which corresponds to US Published Application 2005/0052915 A1), hereby incorporated by reference, describes a three dimensional memory array in which the data state of a memory cell is stored in the resistivity state of the polycrystalline semiconductor material of a pillar shaped semiconductor junction diode. A subtractive method is used to fabricate such pillar diode devices. This method includes depositing one or more silicon, germanium or other semiconductor material layers. The deposited semiconductor layer or layers are then etched to obtain semiconductor pillars. A $SiO_2$ layer can be used as a hard mask for the pillar etching and removed afterwards. Next, $SiO_2$ or other gap fill dielectric material is deposited in between and on top of the pillars. A chemical mechanical polishing (CMP) or etchback step is then conducted to planarize the gap fill dielectric with the upper surface of the pillars.

For additional description of the subtractive pillar fabrication process, see Herner et al., U.S. patent application Ser. No. 11/015,824, "Non-volatile Memory Cell Comprising a Reduced Height Vertical Diode," filed Dec. 17, 2004 and U.S. patent application Ser. No. 11/819,078 filed Jul. 25, 2007. However, in the subtractive method, the height of the semiconductor pillar may be limited by thin and soft photoresist used as the etching mask. The photoresist mask material etches at a slower rate than the semiconductor material, but etches nonetheless, and some mask material must remain when the semiconductor etch is completed. The oxide gap filling step after pillar etch presents a processing challenge when the aspect ratios of the openings between the pillars increases and/or the CMP process or etchback of the gap fill layer removes a significant thickness of the deposited semiconductor material.

SUMMARY

One embodiment of this invention provides a method of making a semiconductor device, including forming a first layer comprising a seed material over an underlying layer, forming a second layer comprising a sacrificial material over the first layer, the sacrificial material being different from the seed material, patterning the first layer and the second layer into a plurality of separate features, forming an insulating filling material between the plurality of the separate features, removing the sacrificial material from the separate features to form a plurality of openings in the insulating filling material such that the seed material is exposed in the plurality of openings, and growing a semiconductor material on the exposed seed material in the plurality of openings.

Another embodiment of this invention provides a method of making a plurality of diodes, including forming a first layer comprising a seed material over an underlying layer, forming a second layer comprising a sacrificial material over the first layer, patterning the first layer and the second layer into a plurality of pillars, each of the plurality of pillars comprising a seed material portion located below a sacrificial material portion, forming an insulating filling material between the plurality of pillars, removing the sacrificial material portion of the plurality of pillars to form a plurality of openings in the insulating filling material such that the seed material portion of the plurality of pillars are exposed in the plurality of openings, and growing a semiconductor material on the exposed seed material portion in the plurality of openings to form the plurality of diodes.

Another embodiment of this invention provides a method of making a non-volatile memory device, including forming a plurality of storage elements of non-volatile memory cells, forming a plurality of pillars, each of the plurality of pillars comprising a seed material portion located below a sacrificial material portion, forming a liner over the plurality of pillars, forming an insulating filling material between the plurality of pillars, removing the sacrificial material portion of the plurality of pillars to form a plurality of openings in the insulating filling material such that the seed material portion of the plurality of pillars are exposed in the plurality of openings, and forming a plurality of diode steering elements in the plurality of openings.

DETAILED DESCRIPTION OF THE PREFERRED EMBODIMENTS

One embodiment of this invention provides a method of making a semiconductor device, including forming a first layer comprising a seed material over an underlying layer, forming a second layer comprising a sacrificial material over the first layer, the sacrificial material being different from the seed material, patterning the first layer and the second layer into a plurality of separate features, forming an insulating filling material between the plurality of the separate features, removing the sacrificial material from the separate features to form a plurality of openings in the insulating filling material such that the seed material is exposed in the plurality of openings, and growing a semiconductor material on the exposed seed material in the plurality of openings.

In some embodiments, the semiconductor device comprises a plurality of diodes formed in the plurality of openings. The plurality of diodes may be pillar shaped in some embodiments. Each of the diodes comprises at least a first conductivity type (e.g., n-type) semiconductor material and a second conductivity type (e.g., p-type) semiconductor material located over the first conductivity type semiconductor material. The orientation of the diode may be reversed in some embodiments. Optionally, the diode may comprise an intrinsic semiconductor material located between the first conductivity type semiconductor material and the second conductivity type semiconductor material.

The semiconductor device may be a non-volatile memory device, comprising a plurality of storage elements and a plurality of diode steering elements. Each storage element is formed underneath or over a corresponding diode steering element. Alternatively, the storage element may be formed between a lower portion (e.g., the first conductivity type semiconductor material) and an upper portion (e.g., the second conductivity type semiconductor material) of the diode.

FIGS. 1a through 1d show a preferred method of forming the pillar device using selective deposition.

Figure 1A:
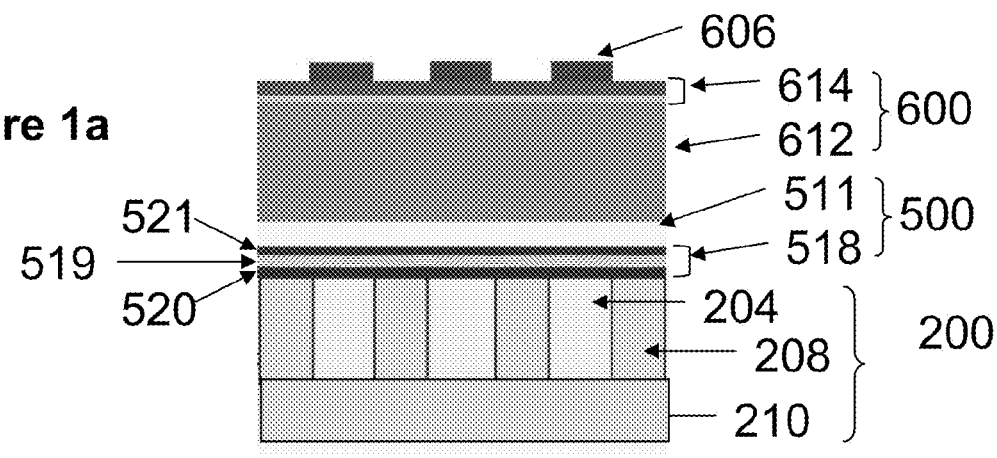
FIGS. 1a to 1e are side cross-sectional views illustrating stages in formation of a semiconductor device according to an embodiment of the present invention.

Referring to FIG. 1a, an underlying layer 200 may be formed over a substrate 210. The substrate can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as glass, plastic, metal or ceramic substrate. The substrate may include integrated circuits fabricated thereon, such as driver circuits for a memory device. An insulating layer (not shown) is preferably formed underneath the underlying layer 200.

In some embodiments, the underlying layer 200 may comprise a plurality of bottom electrodes 204 and an insulating material 208 separating the bottom electrodes 204. Any conducting materials known in the art, such as tungsten and/or other materials, including aluminum, tantalum, titanium, copper, cobalt, or alloys thereof, may be used. In some embodiments, the bottom electrode 204 may further comprise an adhesion layer located over/below a conducting material. For example, the bottom electrodes 204 may comprise a stack of conductive materials, for example, Ti (bottom)/Al/TiN (top), or Ti/TiN/Al/TiN, or Ti/Al/TiW, or any combination of these material. In preferred embodiments, the bottom electrodes 204 may be substantially parallel, substantially coplanar rails.

An insulating material 208, such as silicon oxide, silicon nitride, or silicon oxynitride, can then be formed over and between the bottom electrodes 204, followed by a CMP or etch back step using the top surface of the bottom electrodes 204 as a stop.

A first layer 500 may be formed over an underlying layer 200. The first layer 500 may comprise a seed layer 511 composed of any suitable seed materials, such as Si, Ge, Si—Ge alloy, or a metal silicide, for growing group IV semiconductor materials. Other seed materials may be used for growing III-V, II-VI, etc., semiconductors. The thickness of the seed layer 511 may be about 20-50 nm.

In some embodiments, the first layer 500 may further comprise a storage material stack 518 formed underneath the seed layer 511. The storage material stack 518 may comprise a metal-insulator-metal type stack comprising the storage material layer 519 between two electrically conductive (e.g., TiN) layers 520 and 521. The resistivity switching material layer 519 may comprise any suitable materials, such as an antifuse (i.e., antifuse dielectric), fuse, polysilicon memory effect material, metal oxide (such as nickel oxide, Perovskite materials, etc,), carbon nanotubes (single walled, multi-walled, or a mixture of single and multi-walled nanotubes), amorphous carbon, polycrystalline carbon, graphene resistivity switching material, phase change materials, switchable complex metal oxides, conductive bridge elements, or switchable polymers, etc. In some embodiments, the conductive layer 520 and/or the conductive layer 521 may be omitted if desired.

A second layer 600 may be then formed over the first layer 500. The second layer 600 may comprise a sacrificial layer 612 composed of any suitable sacrificial materials, such as amorphous carbon, silicon nitride, or germanium. Other sacrificial materials, such as organic materials or photosensitive (e.g., photoresist) materials may be used. The second layer 600 may further comprise a hard mask layer 614 formed over the sacrificial layer 612, as shown in FIG. 1a. The hard mask layer 614 may comprise one or more of any suitable hard mask and/or anti-reflective materials, for example silicon oxide, silicon nitride, etc. In some embodiments, the hard mask layer 614 may be omitted if desired.

Finally, photoresist or similar photosensitive material features 606 are formed over the optional hard mask layer 614 (or over the sacrificial layer 612 if the hard mask layer 614 is omitted), resulting in a structure as shown in FIG. 1a. If the sacrificial layer 612 is photosensitive, the features 606 and the hard mask layer 614 may be omitted. In this embodiment, the photosensitive sacrificial layer 614 can be patterned by radiation (if layer 614 is photoresist) or electron beam (if layer 614 is an electron beam sensitive resist).

Figure 1B:
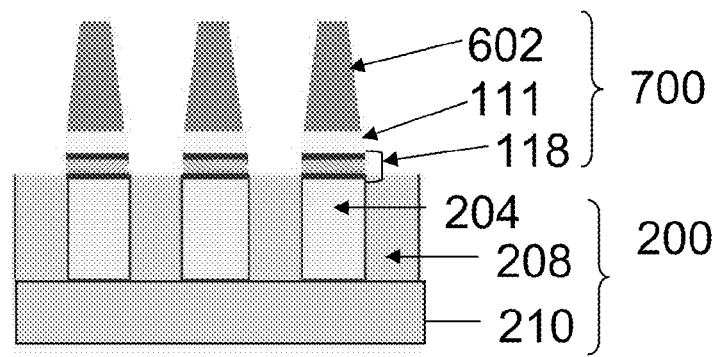

Next, the second layer 600 (e.g., the hard mask layer 614 and the sacrificial layer 612) and the first layer 500 (e.g., the seed layer 511 and the storage material layer 518) are etched using the photoresist features 606 as a mask to form a plurality of separated features 700. Each of the plurality of separated features 700 comprises a seed material portion 111 below a sacrificial material portion 602 and optionally a storage material portion 118 located below the seed material portion 111, as shown in FIG. 1b. The separate features 700 may have a shape of a pillar or a rail. In some embodiments, the plurality of the separate features 700 comprise cylindrical pillars having about the same pitch and about the same width as the electrodes 204 below. Some misalignment can be tolerated.

In some embodiments, the hard mask layer 614 may be completely consumed during the step of etching the stack of the sacrificial layer 612, the first layer 511 and the storage material 518. The shape of the separate features 700 may be but not necessarily tapered as they appear in FIG. 1b.

Alternatively, the first layer 500 may be patterned during the same step of patterning the bottom electrodes 204, rather than being patterned in the same step of patterning the second layer 600. Therefore, in this embodiment, the resulting seed material portion 111 and the storage material portion 118 may have a rail shape as the bottom electrodes 204, rather than a pillar shape of the sacrificial material portions 602.

Figure 1C:
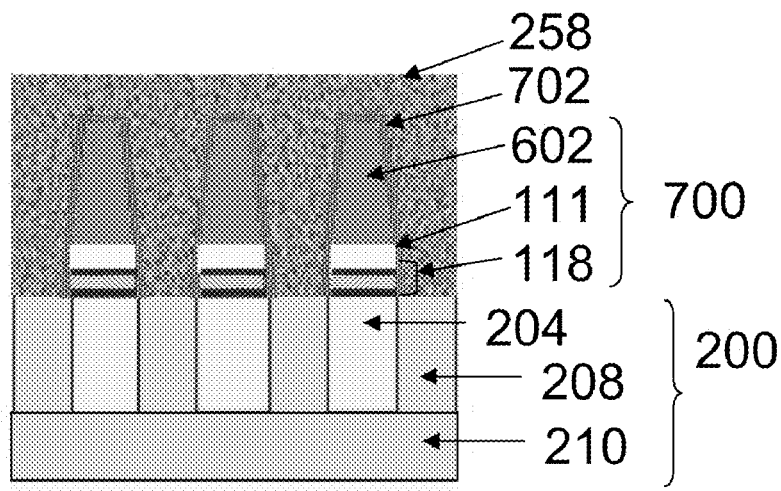
Figure 1D:
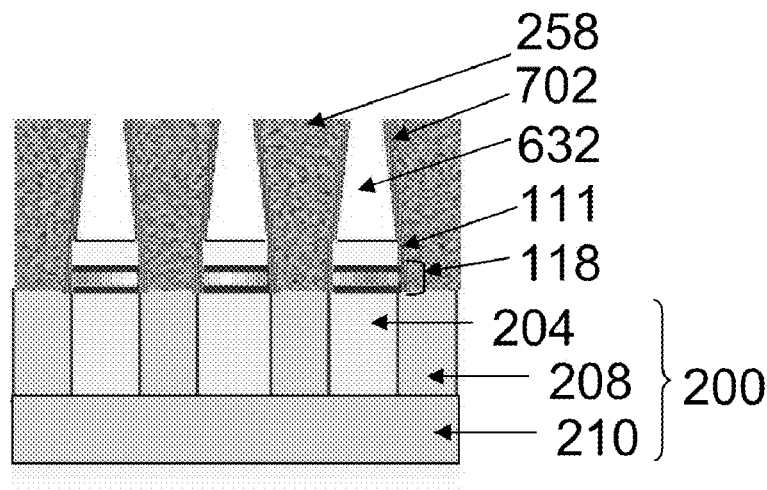

Next, turning to FIG. 1c, a liner 702 may be optionally formed over the plurality of the separate features 700. The liner 702 may comprise silicon nitride or other suitable insulating materials.

An insulating filling material 258 may then be formed over and between the plurality of the separate features 700, resulting in a structure as shown in FIG. 1c. The insulating filling material 258 may comprise an inorganic insulating material such as silicon oxide, silicon nitride, high-dielectric constant film, Si—C—O—H film, or any other suitable insulating material.

Next, this insulating filling material 258 can be planarized by CMP or etch back with the upper surface of the sacrificial material portions 602 as a stop, exposing the sacrificial material portions 602 separated by the insulating filling material 258. The sacrificial material portions 602 are then removed to form a plurality of openings 632 in the insulating filling material 258 such that the seed material portion 111 is exposed in the plurality of openings 632, resulting in a structure shown in FIG. 1d. The removal of the sacrificial material portions 602 may be conducted by selective etching or ashing (if the sacrificial material sections 602 comprise amorphous carbon or other suitable organic material).

Figure 1E:
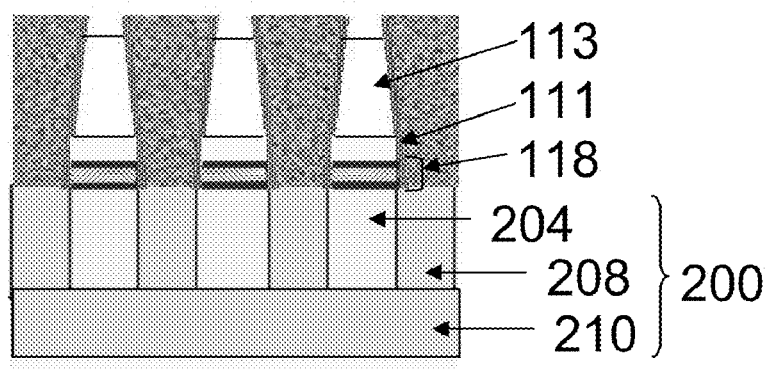
Figure 2A:
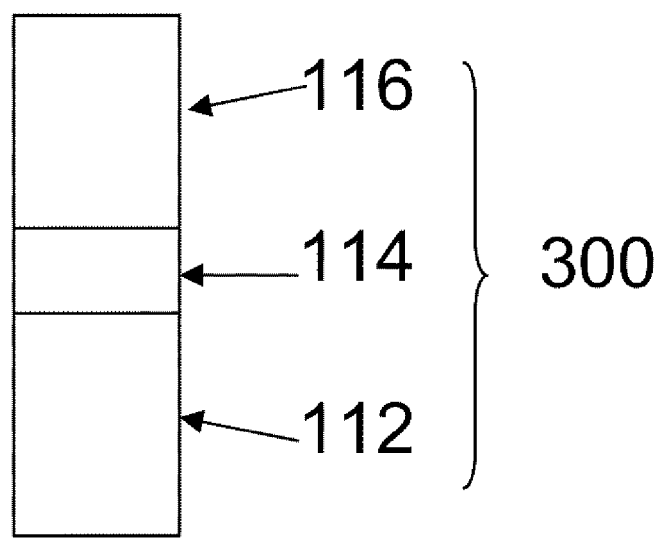
FIGS. 2a to 2b schematically shows structures of diodes of some embodiments of the present invention.
Figure 2B:
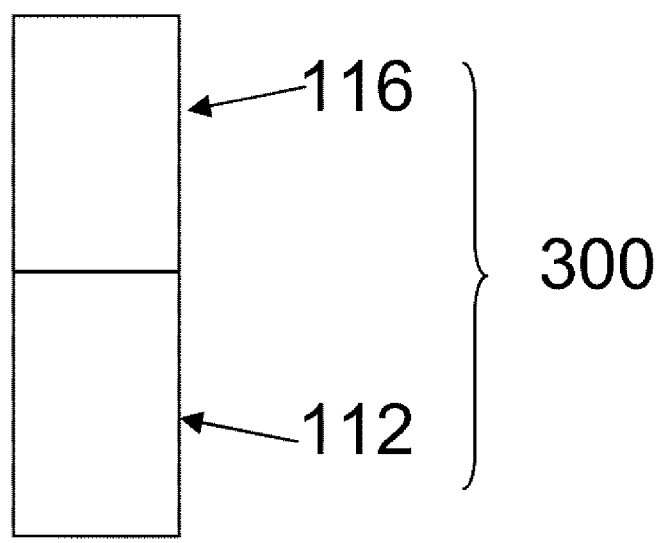

Next, a semiconductor material 113 is formed over the exposed seed material 111 in the plurality of openings 632, as illustrated in FIG. 1e. The openings 632 may be but not necessarily partially filled as they appear in FIG. 1e. In preferred embodiments, the semiconductor material 113 comprises a semiconductor junction diode. The term junction diode is used herein to refer to a semiconductor device with the property of non-ohmic conduction, having two terminal electrodes, and made of semiconducting material which is p-type at one electrode and n-type at the other. Examples include p-i-n diodes 300 as shown in FIG. 2a, in which intrinsic (undoped) semiconductor material 114 is interposed between a first conductivity type (e.g., n-type) semiconductor material 112 and a second conductivity type (e.g., p-type) semiconductor material 116, and p-n diodes and n-p diodes, such as Zener diodes, in which the intrinsic portion 114 is omitted, as shown in FIG. 2b. Of course, the second conductivity type may be n-type instead, while the first conductivity type is p-type.

The semiconductor material 113 of the diode 300 may comprise any suitable semiconductor materials, for example, silicon, germanium, or silicon germanium alloys. The selective growth methods referred to in the below description include any suitable methods for selectively growing the corresponding semiconductor material over the seed material 111 exposed in the openings 632 (i.e., substantially not deposited over the side wall of the openings 632), such as selective CVD methods, e.g., LPCVD using silane and chlorine source gases to deposit silicon. For example, the method described in U.S. application Ser. No. 11/159,031 filed on Jun. 22, 2005 (which published as US Published Application 2006/0292301 A1), incorporated herein by reference, may be used to deposit germanium.

In some embodiments, the step of forming a semiconductor material 113 comprises selectively growing a semiconductor material of a first conductivity type in the plurality of openings 632 over the seed material portion 111 to form a lower portion (i.e., the first conductivity type portion) 112 of the plurality of diodes 300. Any suitable methods may be used for forming the first conductivity type semiconductor material. For example, the step of forming the heavily doped n-type material may comprises depositing intrinsic materials followed by a doping step, or in situ doping by flowing a dopant containing gas providing n-type dopant atoms, for example phosphorus (i.e., in the form of phosphine gas added to the germane and/or silane gas) during a selective CVD of the semiconductor material. Heavily doped region 112 is preferably between about 10 and about 80 nm thick.

The intrinsic material 114 deposition can be conducted during a separate CVD step or by turning off the flow of the dopant gas, such as phosphine, during the same CVD step as the deposition of region 112. The intrinsic region 114 may be between about 40 and about 200 nm, preferably about 50 nm thick.

Figure 3A:
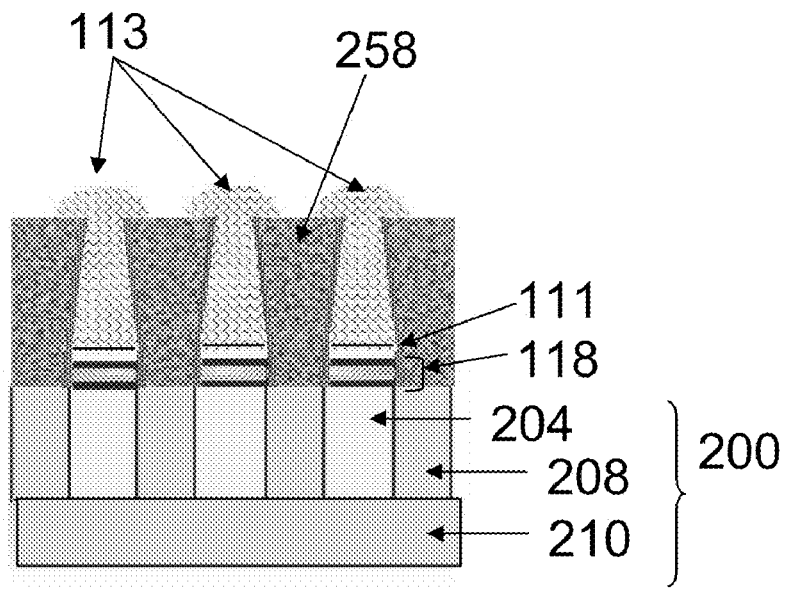
FIGS. 3a to 3c are side cross-sectional views illustrating stages in formation of a semiconductor device according to an embodiment of the present invention.
Figure 3B:
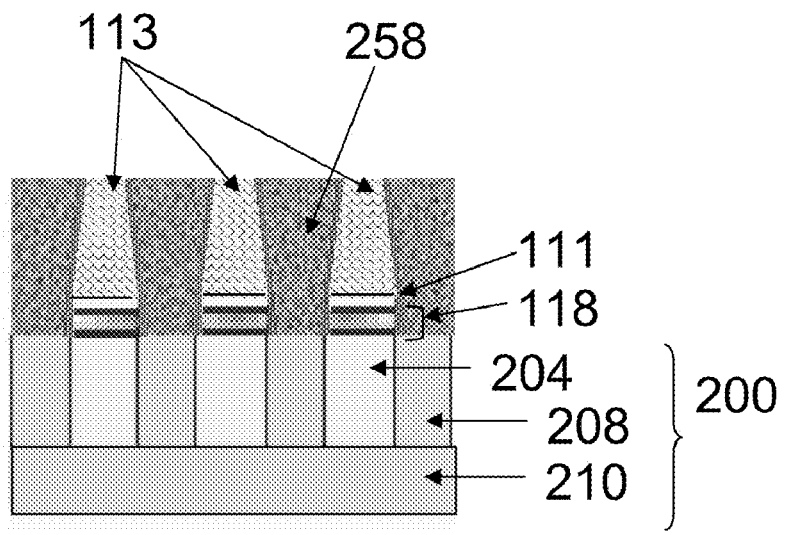

In some embodiments, the semiconductor material 113 may be formed non-selectively in and over the openings 632, as shown in FIG. 3a. In such embodiments, a CMP step may be conducted to remove any bridged semiconductor material 113 on top of the insulating layer 258, forming a structure as illustrated in FIG. 3b. Any other suitable methods may be used for planarizing the semiconductor material 113, for example, a standard dry etch using $HBr/O_2$ chemistry, etc. Non-selective diode deposition methods are described in U.S. patent application Ser. No. 12/007,781 filed Jan. 15, 2008 which is incorporated by reference in its entirety.

Figure 3C:
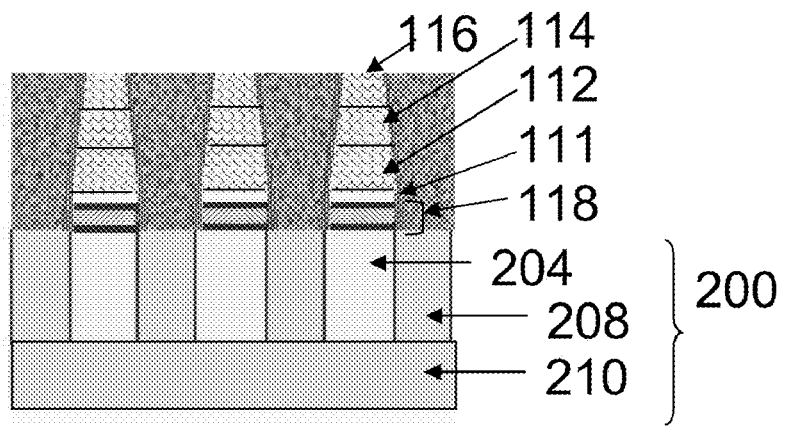

Further, dopants can be implanted into a top portion of the intrinsic semiconductor portion 114 of the plurality of diodes 300 to form an upper portion of the plurality of diode 300, as shown in FIG. 3c. The upper portion 116 of the plurality of diodes 300 comprises a semiconductor material of a second conductivity type different from the first conductivity type. The formation of the second conductivity type region 116 completes formation of pillar shaped diodes 300.

Alternatively, rather than ion implantation, a semiconductor of the second conductivity type may be non-selectively deposited or selectively grown to form an upper portion 116 in the plurality of openings 632 over the intrinsic portion 114 or over the lower portion 112 of the plurality of diodes 300 (if the intrinsic portion 114 is omitted). For example, the p-type top region 116 deposition can be conducted during a separate CVD step from the intrinsic region 114 deposition step, or by turning on the flow of the dopant gas, such as boron trichloride, during the same CVD step as the region 114 deposition step. The p-type region 116 may be between about 10 and about 80 nm thick.

In some other embodiments, the seed material portion 111 comprises a semiconductor material of a first conductivity type, which comprises a lower portion 112 of the plurality of diodes 300 as shown in FIG. 2a. In these embodiments, the step of forming a semiconductor material 113 comprises selectively growing an intrinsic semiconductor material in the plurality of openings 632 over the seed material portion 111 to form an intrinsic portion 114 of the plurality of diodes 300. A semiconductor material of a second conductivity type may then be non-selectively deposited or selectively grown over the intrinsic portion 114 to form an upper portion 116 of the plurality of diodes 300 as shown in FIG. 2a. Alternatively, rather than non-selectively depositing or selectively growing a semiconductor material of a second conductivity type (e.g., p-type) to form an upper portion 116 of the plurality of diodes 300, ion implantation may be conducted to convert a top portion of the intrinsic semiconductor portion 114 to form an upper portion 116 of the plurality of diodes 300. The upper portion 116 comprises a semiconductor material of a second conductivity type different from the first conductivity type.

In the illustrative example, the bottom region 112 is $N^+$ (heavily doped n-type), and the top region 116 is $P^+$. However, the vertical pillar can also comprise other structures. For example, bottom region 112 can be $P^+$ with $N^+$ top region 116. In addition, the middle region can intentionally be lightly doped, or it can be intrinsic, or not intentionally doped. An undoped region (i.e., intrinsic region) will never be perfectly electrically neutral, and will always have defects or contaminants that cause it to behave as if slightly n-doped or p-doped. Such a diode can be considered a p-i-n diode. Thus, a $P^+/N^-/N^+$, $P^+/P^-/N^+$, $N^+/N^-/P^+$ or $N^+/P^-/P^+$ diode can be formed.

In general, the diodes 300 preferably have a substantially cylindrical shape with a circular or roughly circular cross section having a diameter of 250 nm or less. The pitch and width of the diodes 300 are defined by the openings 632, and can be varied as desired. In one preferred embodiment, the pitch of the diodes 300 (the distance from the center of one diode to the center of the next diode) is about 48 nm, while the width of a diodes 300 varies between about 24 and about 28 nm. In another preferred embodiment, the pitch of the diodes 300 is about 48 nm, while the width of the diode 300 varies between about 18 and 24 nm.

Next, upper electrodes 400 can be formed over the diodes 300 and the insulating filling material 258. The upper electrodes may comprise a stack of conductive materials, for example, Ti (bottom)/Al/TiN (top), or Ti/TiN/Al/TiN, or Ti/Al/TiW, or any combination of these material. The TiN or TiW layer on top can serve as an antireflective coating for patterning the conductor and as a polish stop material for subsequent CMP of an insulating layer, as will be described below. The upper electrodes 400 described above are patterned and etched using any suitable masking and etching technique to form substantially parallel, substantially coplanar conductor rails preferably extending perpendicular to the bottom electrodes 204.

Figure 4:
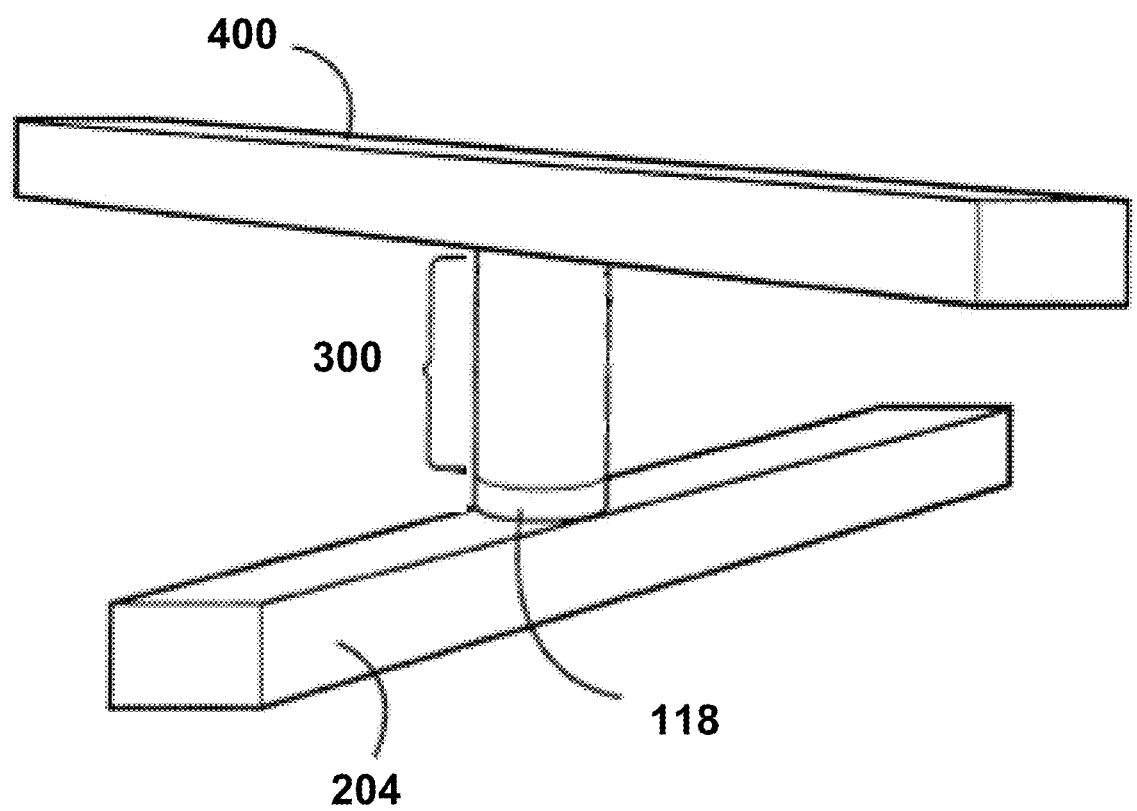
FIG. 4 is a three dimensional view of a completed non-volatile memory device according to an embodiment of the present invention.

Next, another insulating layer (not shown) is deposited over and between conductor rails 400. The insulating layer can be any known electrically insulating material, such as silicon oxide, silicon nitride, or silicon oxynitride. In a preferred embodiment, silicon oxide is used as this insulating material. This insulating layer can be planarized with the upper surface of the conductor rails 400 by CMP or etchback. A three dimensional view of the resulting device is shown in FIG. 4.

In an alternative embodiment, the storage element may be located over the semiconductor diode or between the lower portion and the upper portion of the diode, rather than below the diode. In this embodiment, the storage material layer located below the seed layer as explained above may be omitted, and a storage element is formed after forming the diode in the openings. In another non-limiting example, the seed layer comprises the lower portion of the diode, an intrinsic portion is selectively grown over the seed layer, and the storage material layer is then formed over the intrinsic portion of the diode prior to non-selectively depositing the upper portion of the diode. In this non-limiting example, the resulting structure comprises a storage portion located between the lower portion and the upper portion of the diode.

The semiconductor device may comprise a one-time programmable (OTP) or re-writable non-volatile memory cells. For example, each diode 300 may act as a steering element of a memory cell and the storage material 118 acts as a resistivity switching material (i.e., which stores the data by a permanent change in resistivity state after application of programming current or voltage) located in series with the diode 300 between the electrodes 204 and 400, as shown in FIG. 4.

In some embodiments, the pillar diode 300 itself may be used as the data storage device. In these embodiments, the resistivity of the diode 300 is varied by the application of a forward and/or reverse bias provided between the electrodes 204 and 400, as described in U.S. patent application Ser. No. 10/955,549 filed Sep. 29, 2004 (which corresponds to US Published Application 2005/0052915 A1) and U.S. patent application Ser. No. 11/693,845 filed Mar. 30, 2007 (which corresponds to US Published Application 2007/0164309 A1), both of which are incorporated by reference in their entirety. In this embodiment, the resistivity switching material 118 may be omitted if desired.

Optionally, one or more adhesion/barrier layers may be formed to improve the performance of the resulting device. Any suitable materials may be used as the optional adhesion/barrier layer(s), for example, transition metals, metal silicide, metal nitride, such as titanium, titanium silicide, titanium nitride, tungsten silicide, tungsten nitride, nickel silicide, or nickel nitride. For example, in one embodiment, a titanium nitride adhesion layer is formed between the storage material portion and the seed material portion.

Formation of a first memory level has been described. Additional memory levels can be formed above this first memory level to form a monolithic three dimensional memory array. In some embodiments, conductors can be shared between memory levels; i.e. top conductor 400 would serve as the bottom conductor of the next memory level. In other embodiments, an interlevel dielectric (not shown) is formed above the first memory level, its surface planarized, and construction of a second memory level begins on this planarized interlevel dielectric, with no shared conductors.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays. In contrast to the process described in Leedy, in an embodiment of the present invention, diodes share a conducting wire or electrode between two adjacent layers. In this configuration, the "bottom" diode will "point" in the opposite direction of the diode in the "upper" layer (i.e., the same conductivity type layer of each diode electrically contacts the same wire or electrode located between the diodes). With this configuration, the two diodes can share the wire between them and still not have a read or write disturb issue.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

One advantage of the above described embodiments is that the selective growth (e.g., quasi-epitaxial growth) of the semiconductor material (e.g., Si, Ge, or Si—Ge) in the openings may result in grains much larger than those of semiconductor materials deposited by conventional non-selective deposition methods. Such large grained material (e.g., large grained polysilicon) may withstand higher currents required for switching the storage materials of the memory cell. Consequently, a high temperature post-annealing that is conventionally used to increase the grain size may be omitted. Further, the adhesion of layers during the fabrication steps of the memory cell may be improved by replacing the step of etching a thick stack of device layers required by conventional methods with a step of etching sacrificial materials, which is significantly easier to etch.

NON-LIMITING EXAMPLE

In a non-limiting example, a tungsten bottom electrode is formed. Then, a TiN layer, a polycrystalline silicon seed layer and an advanced patterning film (i.e., an amorphous carbon sacrificial material, also referred to as APF layer) are deposited over the bottom electrode in that order.

Figure 5:
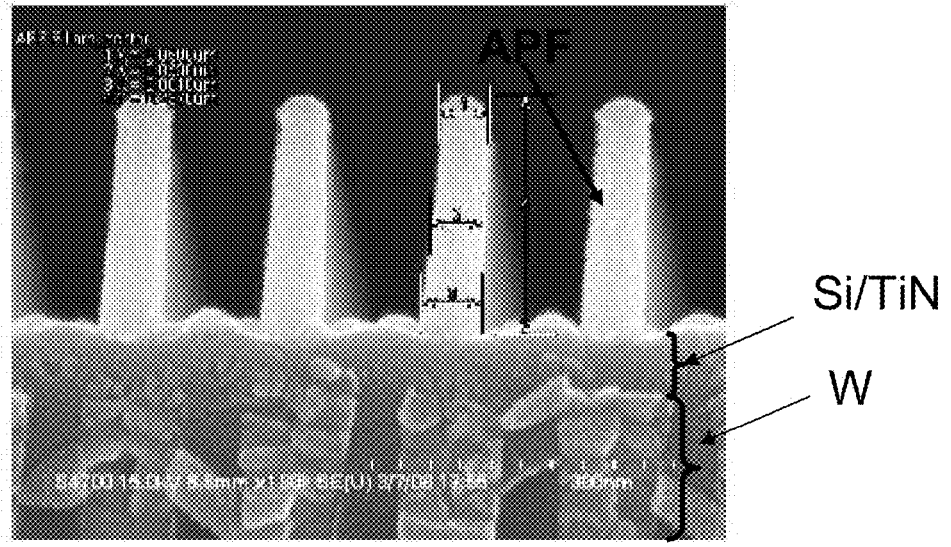
FIGS. 5 through 8 are cross-sectional SEM images of stages in formation of a semiconductor device according to a non-limiting example of the present invention.

Then, this stack of TiN/Si/APF layers is patterned to form a plurality of pillars. FIG. 5 shows an SEM image where the APF layer has been etched into pillars over the Si and TiN layers.

Figure 6:
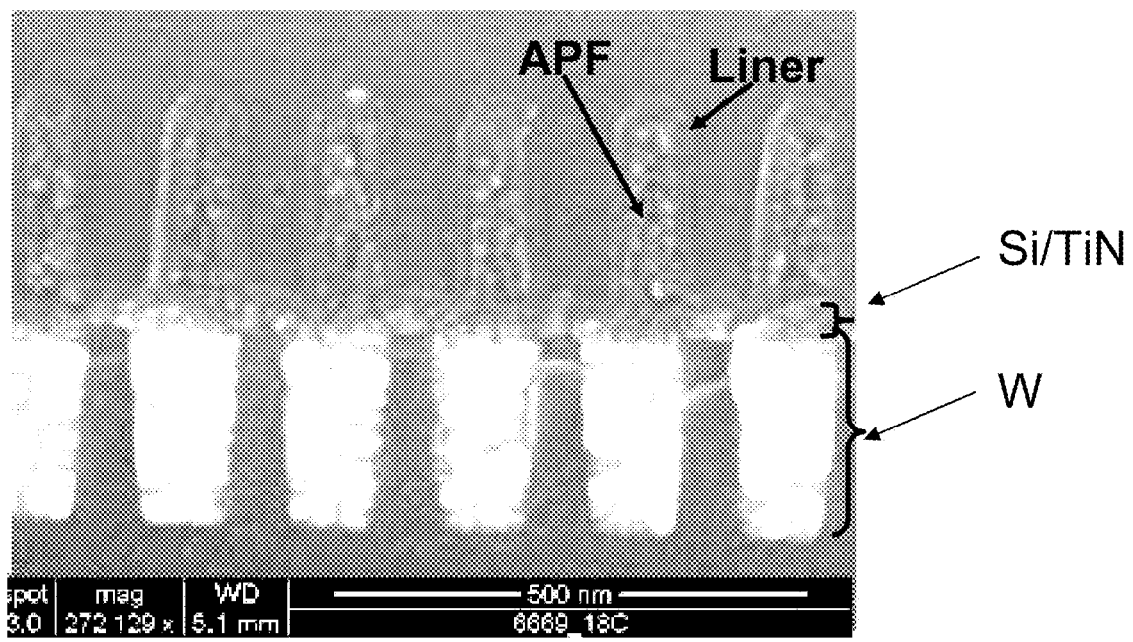

A silicon nitride liner is then formed over and between the TiN/Si/APF pillars. This step is shown in FIG. 6. Then, a silicon oxide insulating filling layer is formed over and between the pillars by PECVD. The amorphous carbon in the pillars shrinks to a smaller size during the step of depositing the silicon oxide filling material, possibly due to the oxide plasma used for depositing the silicon oxide filling material.

Figure 7:
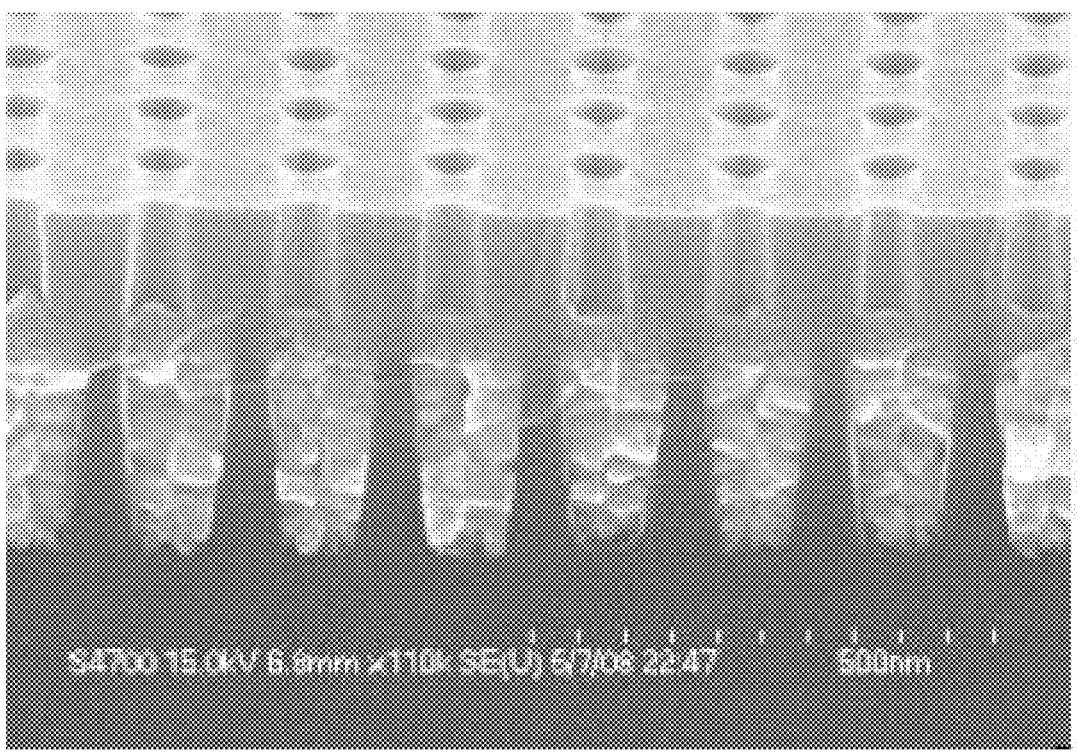

After a CMP step planarizing the silicon oxide filling material using the top surface of the amorphous carbon pillar portions as a stop, the carbon portions of the pillars are removed by oxygen plasma ashing, forming an array of openings, as shown in FIG. 7. The silicon seed material is exposed in the array of openings.

Figure 8:
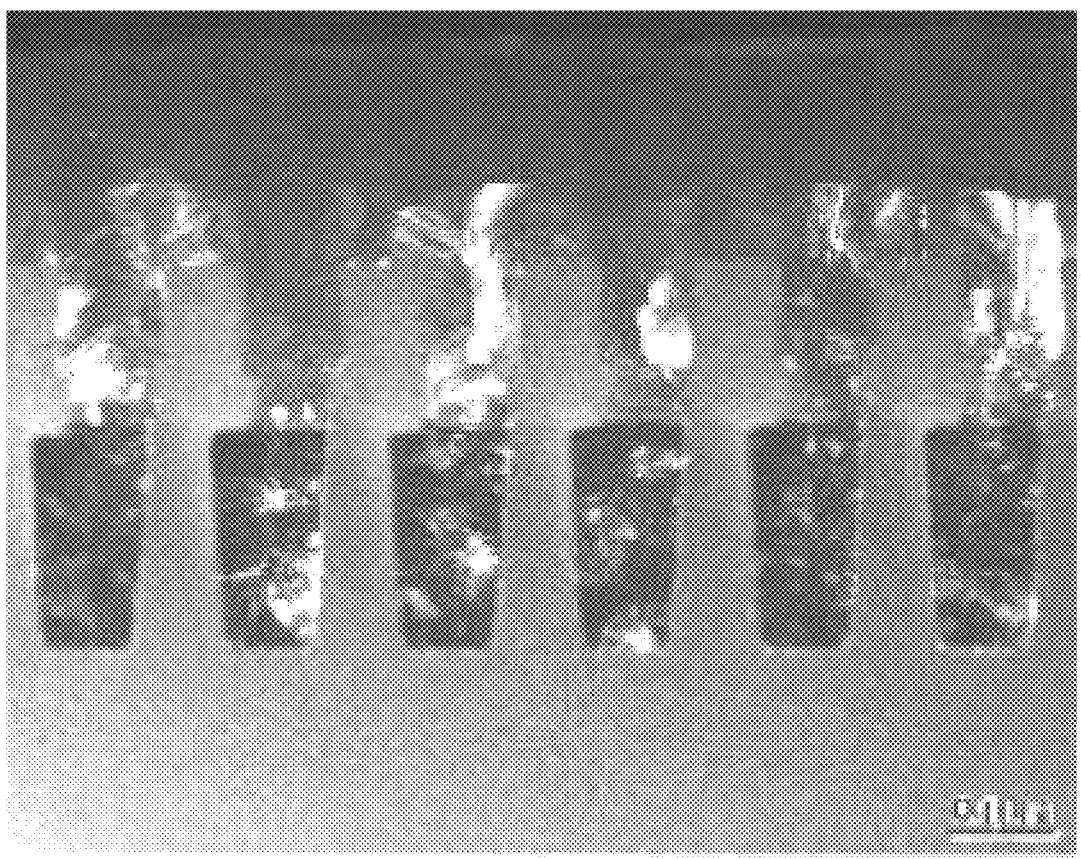

Silicon pillars are then selectively grown on the silicon seed material exposed in the openings as shown in FIG. 8. In this non-limiting example, a low pressure chemical vapor deposition (LPCVD) is conducted at 620° C. with $SiH_4$ and $Cl_2$ used as the source gases. The average grain width of the grown silicon material is about 15 to 25 nm, extending vertically all the way from the bottom to the top of the hole. Approximately, only two to four, such as three, polycrystalline grains are formed in each opening in this non-limiting example. The grain size and number of grains per hole may vary if the parameters of LPCVD and/or the size of the hole changes.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Although certain supporting circuits and fabrication steps are not specifically described, such circuits and protocols are well known, and no particular advantage is afforded by specific variations of such steps in the context of practicing this invention. Moreover, it is believed that one of ordinary skill in the art, equipped with the teaching of this disclosure, will be able to carry out the invention without undue experimentation.

The foregoing details description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, that are intended to define the scope of this invention.

What is claimed is:

1. A method of making a semiconductor device, comprising:
   forming a first layer comprising a seed material over an underlying layer;
   forming a second layer comprising a sacrificial material over the first layer, the sacrificial material being different from the seed material;
   patterning the first layer and the second layer into a plurality of separate features, each of the plurality of separate features comprising at least a seed material portion located below a sacrificial material portion;
   forming an insulating filling material between the plurality of the separate features;
   removing the sacrificial material portion from the separate features to form a plurality of openings in the insulating filling material such that the seed material portion is exposed in the plurality of openings; and
   growing a semiconductor material on the exposed seed material in the plurality of openings.

2. The method of claim 1, wherein the seed material comprises a metal silicide.

3. The method of claim 1, wherein:
   the seed material comprises a semiconductor material of a first conductivity type; and
   the step of growing the semiconductor material comprises selectively growing an intrinsic semiconductor material or a semiconductor material of a second conductivity type.

4. The method of claim 1, wherein the seed material and the semiconductor material each comprise Si, Ge, or Si—Ge alloy.

5. The method of claim 1, wherein:
   the sacrificial material comprises amorphous carbon, silicon nitride or Ge; and
   the insulating filling material comprises an inorganic insulating material.

6. The method of claim 1, further comprising forming a liner over the plurality of the separate features prior to the step of forming the insulating filling material between the plurality of the separate features.

7. The method of claim 1, wherein each of the plurality of the separate features comprises a pillar or a rail.

8. The method of claim 1, wherein each of the plurality of the separate features comprises a cylindrical pillar and wherein the semiconductor device comprises a diode.

9. A method of making a plurality of diodes, comprising:
   forming a first layer comprising a seed material over an underlying layer;
   forming a second layer comprising a sacrificial material over the first layer;
   patterning the first layer and the second layer into a plurality of pillars, each of the plurality of pillars comprising a seed material portion located below a sacrificial material portion;
   forming an insulating filling material between the plurality of pillars;
   removing the sacrificial material portion of the plurality of pillars to form a plurality of openings in the insulating filling material such that the seed material of the plurality of pillars are exposed in the plurality of openings; and
   growing a semiconductor material on the exposed seed material in the plurality of openings to form the plurality of diodes.

10. The method of claim 9, wherein the seed material comprises a metal silicide.

11. The method of claim 9, wherein the seed material and the semiconductor material comprise Si, Ge, or Si—Ge alloy.

12. The method of claim 9, wherein:
   the sacrificial material comprises amorphous carbon, silicon nitride or Ge; and
   the insulating filling material comprises an inorganic filling material.

13. The method of claim 9, further comprising forming a liner over the plurality of pillars prior to the step of forming the insulating filling material between the plurality of the separate features.

14. The method of claim 9, wherein:
   the seed material comprises a semiconductor material of a first conductivity type, which comprises a lower portion of the plurality of diodes; and
   the step of growing a semiconductor material comprises selectively growing an intrinsic semiconductor material in the plurality of openings over the seed material to form an intrinsic portion of the plurality of diodes.

15. The method of claim 14, further comprising:
   forming an upper portion of the plurality of diodes in the plurality of openings over the intrinsic semiconductor portion,
   wherein:
   the upper portion comprises a semiconductor material of a second conductivity type different from the first conductivity type; and
   the step of forming the upper portion comprises non-selectively depositing or selectively growing a semiconductor of the second conductivity type.

16. The method of claim 14, further comprising implanting dopants into a top portion of the intrinsic semiconductor portion to form an upper portion of the plurality of diodes, wherein the upper portion comprises a semiconductor material of a second conductivity type different from the first conductivity type.

17. The method of claim 9, wherein the step of growing a semiconductor material comprises selectively growing a semiconductor material of a first conductivity type in the plurality of openings over the seed material to form a lower portion of the plurality of diodes.

18. The method of claim 17, further comprising:
selectively growing or non-selectively depositing an intrinsic portion of the plurality of diodes in the plurality of openings over the lower portion of the plurality of diodes; and
implanting dopants into a top portion of the intrinsic semiconductor portion of the plurality of diodes to form an upper portion of the plurality of diodes, the upper portion of the plurality of diodes comprising a semiconductor material of a second conductivity type different from the first conductivity type.

19. The method of claim 17, further comprising:
forming an upper portion of the plurality of diodes in the plurality of openings over the lower portion of the plurality of diodes,
wherein:
the upper portion comprises a semiconductor material of a second conductivity type different from the first conductivity type; and
the step of forming the upper portion comprises non-selectively depositing or selectively growing a semiconductor of the second conductivity type.

20. The method of claim 19, further comprising forming an intrinsic portion of the plurality of diodes in the plurality of openings over the lower portion of the plurality of diodes prior to the step of forming the upper portion, wherein the step of forming the intrinsic portion comprises non-selectively depositing or selectively growing an intrinsic semiconductor.

21. A method of making a non-volatile memory device, comprising:
forming a plurality of storage elements of non-volatile memory cells;
forming a plurality of pillars, each of the plurality of pillars comprising a seed material portion located below a sacrificial material portion;
forming a liner over the plurality of pillars;
forming an insulating filling material between the plurality of pillars;
removing the sacrificial material portion of the plurality of pillars to form a plurality of openings in the insulating filling material such that the seed material portion of the plurality of pillars are exposed in the plurality of openings; and
forming a plurality of diode steering elements in the plurality of openings.

22. The method of claim 21, wherein:
each of the plurality of diode steering elements comprises at least a lower portion and an upper portion located over the lower portion;
each of the plurality of storage elements is selected from a group consisting of antifuse, fuse, metal oxide memory, switchable complex metal oxide, carbon nanotube memory, graphene resistivity switchable material, carbon resistivity switchable material, phase change material memory, conductive bridge element, or switchable polymer memory; and
in each non-volatile memory cell, the storage element is located over the diode steering element, or underneath the diode steering element, or between the lower portion and the upper portion of each of the plurality of diode steering elements.

23. The method of claim 21, wherein the step of forming the plurality of diode steering elements in the plurality of openings comprises selectively growing a semiconductor material of a first conductivity type in the plurality of openings over the seed material portion to form a lower portion of the plurality of diode steering elements.

24. The method of claim 23, wherein the step of forming a plurality of diode steering elements in the plurality of openings further comprises:
non-selectively depositing or selectively growing an intrinsic semiconductor to form an intrinsic portion of the plurality of diode steering elements in the plurality of openings over the lower portion of the plurality of diode steering elements; and
implanting dopants into a top portion of the intrinsic semiconductor portion to form the upper portion of the plurality of diode steering elements, the upper portion of the plurality of diode steering elements comprising a semiconductor material of a second conductivity type different from the first conductivity type.

25. The method of claim 23, wherein the step of forming the plurality of diode steering elements in the plurality of openings further comprises non-selectively depositing or selectively growing a semiconductor of a second conductivity type different from the first conductivity type to form the upper portion of the plurality of diode steering elements in the plurality of openings over the lower portion of the plurality of diode steering elements.

26. The method of claim 25, wherein the step of forming the plurality of diode steering elements in the plurality of openings further comprises selectively growing an intrinsic semiconductor in the plurality of openings to form an intrinsic portion of the plurality of diode steering elements over the lower portion of the plurality of diode steering elements prior to the step of forming the upper portion of the plurality of diode steering elements.

* * * * *